United States Patent [19]

Masleid

[11] Patent Number: 5,614,845
[45] Date of Patent: Mar. 25, 1997

[54] INDEPENDENT CLOCK EDGE REGULATION

[75] Inventor: Robert P. Masleid, Austin, Tex.

[73] Assignee: International Business Machines Corporation, Armonk, N.Y.

[21] Appl. No.: 525,997

[22] Filed: Sep. 8, 1995

[51] Int. Cl.$^6$ ................................................ H03K 19/00
[52] U.S. Cl. .......................... 326/93; 327/292; 327/298
[58] Field of Search .................... 326/93; 327/5, 327/12, 146, 155, 161, 166, 170, 292, 294, 298

[56] References Cited

U.S. PATENT DOCUMENTS

| | | | |
|---|---|---|---|
| 4,276,594 | 6/1981 | Morley | 364/200 |
| 4,811,343 | 3/1989 | Johansson et al. | 371/15 |
| 4,887,235 | 12/1989 | Holloway et al. | 364/900 |
| 5,056,015 | 10/1991 | Baldwin et al. | 364/200 |
| 5,059,818 | 10/1991 | Witt et al. | 327/292 |
| 5,097,437 | 3/1992 | Larson | 395/775 |
| 5,155,380 | 10/1992 | Hwang et al. | 326/93 |
| 5,214,682 | 5/1993 | Clark | 377/56 |
| 5,278,873 | 1/1994 | Lowery et al. | 375/118 |
| 5,325,516 | 6/1994 | Blomgren et al. | 395/550 |
| 5,361,277 | 11/1994 | Grover | 327/292 |
| 5,418,822 | 5/1995 | Schlachter et al. | 326/93 |
| 5,453,708 | 9/1995 | Gupta et al. | 326/98 |
| 5,483,180 | 1/1996 | Chai et al. | 326/93 |
| 5,517,136 | 5/1996 | Harris et al. | 326/93 |

OTHER PUBLICATIONS

IBM Technical Disclosure Bulletin, vol. 25, No. 3A Aug. 1982; pp. 1057–1058.
IBM Technical Disclosure Bulletin, vol. 26 No. 5 Oct. 1983; pp. 2377–2378.
IBM Technical Disclosure Bulletin vol. 35 No. 1A Jun. 1992; pp. 284–287.
IBM Technical Disclosure Bulletin vol. 35 No. 3 Aug. 1992; pp. 80–81.
IBM Technical Disclosure Bulletin, vol. 37 No. 6A Jun. 1994; pp. 349–351.

*Primary Examiner*—David R. Hudspeth
*Assistant Examiner*—Richard Roseen
*Attorney, Agent, or Firm*—Benman Collins & Sawyer; Michael A. Davis, Jr.

[57] ABSTRACT

A clock regulator that provides two controlled timing references per clock cycle on a single clock distribution. The regulator includes two phase detectors and phase aligner pairs to independently regulate both rising and falling edges of the clock distribution, rather than regulating only one edge as conventional regulators.

12 Claims, 4 Drawing Sheets

5,614,845

INDEPENDENT CLOCK EDGE REGULATION

CROSS-REFERENCE TO RELATED APPLICATIONS

The present application is related to applications Ser. No. 08/525,448, entitled "Split Drive Clock Buffer," Ser. No. 08/525,449, entitled "Clock Regulator with Precision Midcycle Edge Timing," and Ser. No. 08/525,325, entitled "Precision Time Interval Division With Digital Phase Delay Lines" filed on the same date as the present application and assigned to the assignee of the present application.

FIELD OF THE INVENTION

The present invention relates to clock distribution on a microprocessor chip, and more particular to a system and method for generating an internal clock signal.

BACKGROUND OF THE INVENTION

In large high-performance very large scale integration (VLSI) chips, an internal clock signal is distributed throughout the chip to control timing of the chip as a function of an external system clock. Both the clock signals include a rising edge and a falling edge every clock cycle. The internal clock cycle time comprises several components, such as delays associated with storage devices on the chip, clock skew, logic evaluation, and signal transmission. Of these four components only the logic evaluation component performs real work, the other three components are overhead that merely add to the cycle time.

The internal clock signal is typically generated from the external clock by a circuit called a clock buffer, and then distributed to the circuits in the chip through some form of on-chip clock distribution network. Ordinarily, the clock buffer includes a large inverter that receives the external clock signal and transmits a modified signal to two output transistors, which transmit the internal clock signal to the on-chip clock distribution network.

It is advantageous to have the clock signal transition between voltage and ground as fast as possible. This entails producing an edge as fast as possible, while maintaining the time the edge rises or falls during each clock cycle.

During the transition of the clock edge, the inverter momentarily diverts the current intended to drive the clock distribution network through the two output transistors by briefly turning both devices on. This is disadvantageous since this current degrades the transition time of the clock edge by diverting current away from the clock distribution. A further disadvantage of the inverter is that there is no way to provide independent control of the two output transistors.

A clock edge will appear to be less accurate if the clock edge is slow. This is because noise is always superimposed on the clock. The noise artificially moves the edge position forward or backward in time by temporarily shifting the voltage on the clock distribution. If the edge transition can be made faster, then the apparent accuracy of the clock improves, because faster clock transitions decrease noise-generated clock skew. With less skew, more machine cycle time is available to perform useful logic at a given frequency.

Accordingly, what is needed is a system and method for generating a faster clock edge. The present invention addresses such a need.

SUMMARY OF THE INVENTION

The present invention is a clock edge regulator circuit that is coupled to a clock buffer that drives a clock distribution having a rising edge and a falling edge. The circuit comprises an input clock signal also having a rising edge and a falling edge, and rising edge regulator means responsive to the rising edge of the input clock signal and to the rising edge of the clock distribution for providing a first delayed clock signal to the clock buffer. The circuit further comprises a falling edge regulator means responsive to the falling edge of the input clock signal and to the falling edge of the clock distribution for providing a second delayed clock signal to the clock buffer, thereby independently regulating the rising and falling edges of the clock distribution.

According to the system and method disclosed herein, the present invention decreases clock duty cycle skew and thereby devotes more machine cycle time to performing useful logic.

DESCRIPTION OF THE INVENTION

The present invention relates to an improvement in clock signal generation. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

The present invention is a system and method for increasing clock edge transition speed and edge phase accuracy by splitting the external clock signal and separately controlling the two output transistors. To more particularly illustrate the clock signal generation system in accordance with the present invention, refer now to FIG. 1 depicting one embodiment of such a system.

Figure 1:
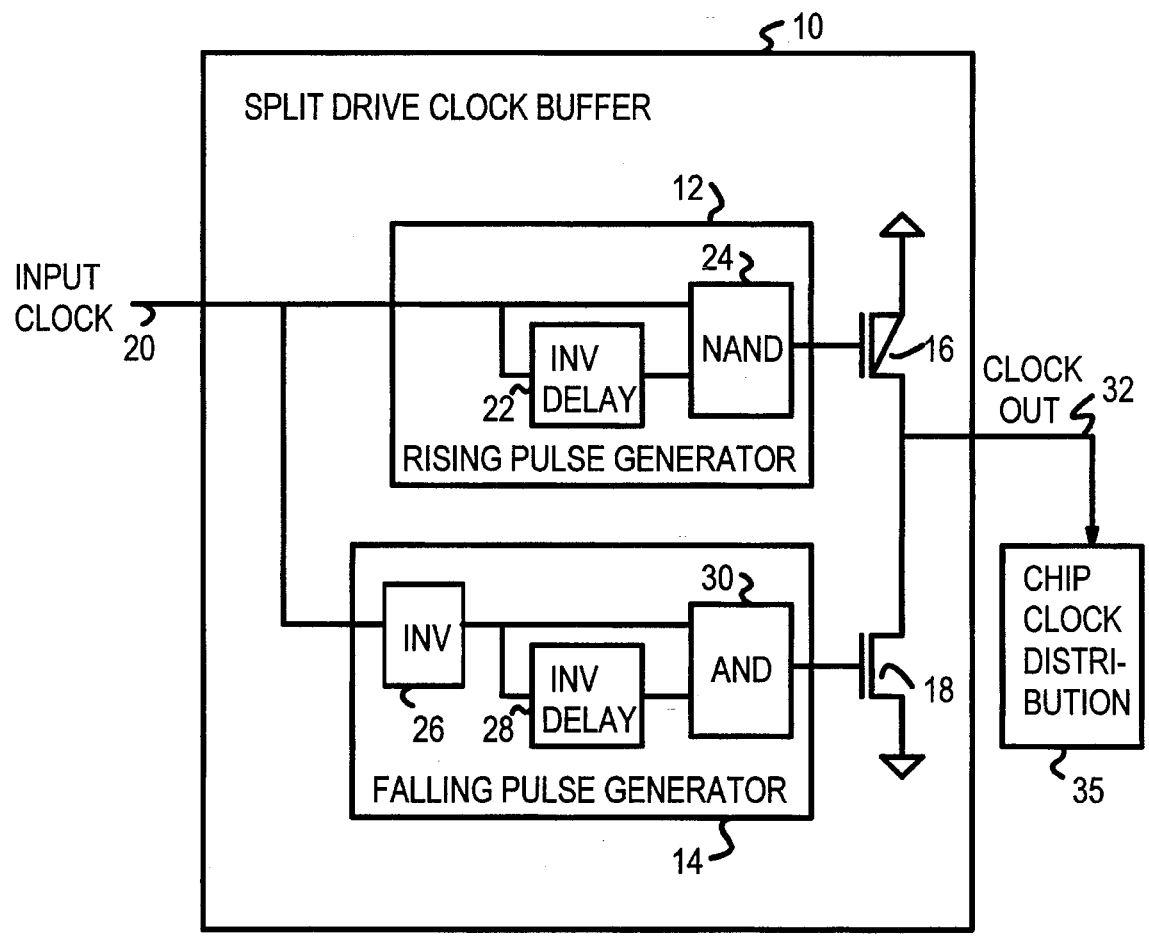
FIG. 1 is a block diagram illustrating a split drive clock buffer of the present invention.

FIG. 1 is a block diagram illustrating a split drive clock buffer 10 of the present invention, which includes two edge-triggered pulse generators 12 and 14. When an input clock 20 transitions, the edge-triggered pulse generator 12 drives the output transistor 16, and the edge-triggered pulse generator 14 drives the output transistor 18. The output of the two output transistors 16 and 18 creates an output clock signal 32, which is input to an on-chip clock distribution network 35. In a preferred embodiment, the output transistor 16 is PFET pull-up transistor, and the output transistor 18 is a NFET pull-down transistor.

The edge-triggered pulse generator 12, called a rising pulse generator, includes a delay chain comprising an inverter delay 22 and a NAND gate 24. The input to the inverter delay 22 is the input clock 20, and the input to the NAND gate 24 is both the input clock 20 and the inverter delay 22.

The edge-triggered pulse generator 14, called a falling pulse generator, includes a delay chain comprising an inverter 26, an inverter delay 28 and an AND gate 30. The input to the inverter 26 is the input clock 20. The output of the inverter 26 is coupled to both the inverter delay 28 and to the AND gate 30.

On detecting the rising edge of the input clock 20, the rising pulse generator 12 briefly activates the output transistor 16, and then deactivates the output transistor 16 before the falling edge begins. On the falling edge of the input clock 20, the falling pulse generator 14 briefly activates the output transistor 18, and then deactivates the output transistor 18 before the rising edge begins. Between the edges of the input clock 20, the output of the split drive clock buffer 10 is in a high impedance state (off).

According to the present invention, by separately driving the output transistors 16 and 18, the transition speed of the input clock is increased by ensuring that the opposing output transistor is shut down before the next clock transition begins. Each clock transition begins and ends with a high impedance state. For example, on a rising input clock edge, the PFET transistor 12 is activated and the NFET transistor 14 has long been deactivated.

Leaving the chip clock distribution in a high impedance state between transitions is harmless. The clock distribution voltage should remain stable between transitions due to its inherent large capacitance and low resistance. If capacitive coupling to the clock is still a problem, the duration of the high impedance condition can be reduced by increasing the pulse widths to the output transistors 16 and 18. Another alternative is providing some of the clock drive with a conventional buffer.

INDEPENDENT CLOCK EDGE REGULATION

In microprocessor design, both the frequency and the duty cycle (a percentage of time that a clock signal is asserted) of the external clock are commonly used to control the frequency, duty cycle, and phase of the on-chip clock distribution.

Prior methods for driving the on-chip clock signal by an inverter chain cannot adjust both the frequency of the clock distribution and the duty cycle of the clock distribution. Typically, the frequency is dependent on the external clock input frequency, and the duty cycle is dependent on the external duty cycle and the behavior of the inverter chain. Alternatively, a frequency multiplier followed by a frequency divider are used to remove the dependency on the external clock duty cycle. The disadvantage of this clock scheme is that it does not eliminate duty cycle error due to clock distribution.

Conventional dock regulators for controlling edge phase use a single feedback mechanism, such as a phase locked loop and a standard buffer to match the phase of the on-chip clock distribution with the external clock. Only one edge, however, is regulated per clock cycle, the other drifts with device operating conditions, semiconductor process variations, and external frequency source duty cycle. Clock schemes using clock multipliers only eliminate the dependencies on the external clock duty cycle.

In order to regulate the duty cycle, it is important to acquire independent control of when the rising edge occurs versus the falling edge. Therefore, use of a conventional inverter is inadequate since it cannot independently control both edges.

Figure 2:
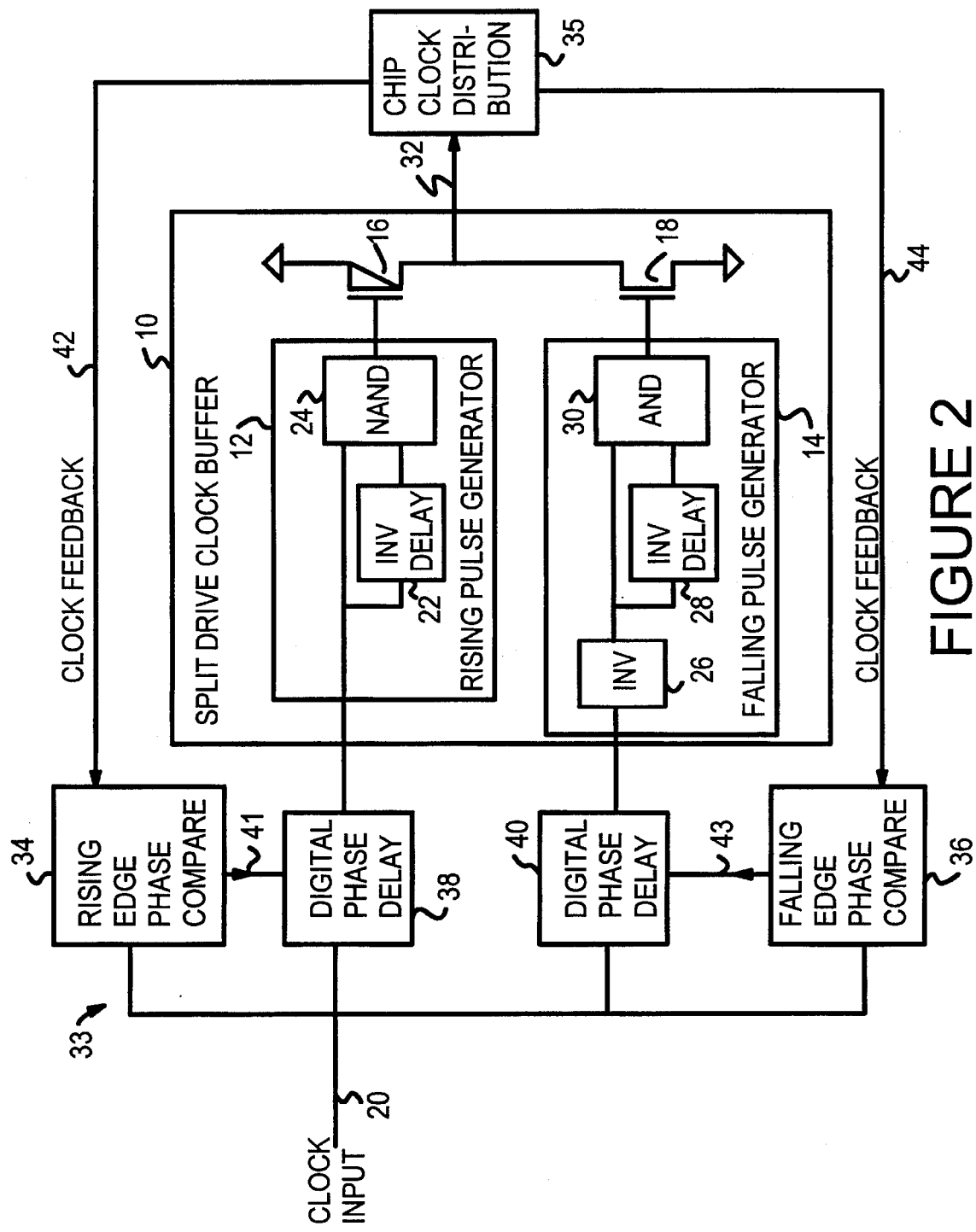
FIG. 2 is a block diagram of an independent clock edge regulator in accordance with present invention.

According to the present invention, a clock edge regulator circuit is provided for each of the independent control mechanisms 12 and 14 shown in FIG. 1. Referring now to FIG. 2, an independent clock edge regulator 33 is shown in accordance with the present invention. The independent clock edge regulator 33 comprises a rising edge phase compare 34 coupled to a digital phase delay 38, and a falling edge phase compare 36 coupled to a second digital phase delay 40. The output clock signal 32 from the split drive clock buffer 10 drives the clock distribution 35, and clock feedback loops 42 and 44 input the rising edge and the falling edge of the clock distribution 35 into the rising phase compare 34 and into the falling phase compare 36, respectively.

The rising edge phase compare circuit 34 detects the phase difference between the rising edge of the input clock 20 and the rising edge of the clock distribution 35, and provides control signals to the digital phase delay 38 via control lines 41 based on the phase difference. The falling edge phase compare circuit 36 detects the phase difference between the falling edge of the input clock 20 and the falling edge of the clock distribution 35, and provides control signals to the digital phase delay 40 via control lines 43 based on the phase difference.

A phase detector and shift register (not shown) comprise the phase compare circuits 34 and 36. A positive phase difference between the two clock signals shifts 1's into the register from one end and a negative difference shifts 0's from the other. The register bits drive the control lines 41 and 43 that are input to the digital phase delays 38 and 40.

The digital phase delay circuits 38 and 40 delay the input clock 20 by a variable amount specified by the phase compare circuits 34 and 36. The digital phase delays 38 and 40 both comprise identical digital stages of fixed delay. Each delay stage is switched in or out of the signal delay path by the input from the control lines 41 and 43. The delay achieved is therefore an integer multiple of the basic stage delay. The delay is limited to the number of stages times the basic stage delay.

Thus, the digital phase delay 38 provides a delay from the rising edge of the input clock 20 to the rising edge of the chip clock distribution 35. The second digital phase delay 40 provides a delay from the falling edge of the input clock 20 to the falling edge of the chip clock distribution 35.

The use of the two phase compares 34 and 36 for detecting the phase of the clock edges, and the two phase delays 38 and 40 for aligning the clock edges, independently regulates the phase of the rising and falling edges of the clock distribution 35. Both the frequency and the duty cycle of the clock distribution 35 match those of the input clock 20. Accordingly, the independent clock edge regulator 33 of the present invention provides two controlled timing references per cycle on a single clock distribution without resorting to frequency multipliers and divide circuits.

The independent clock edge regulator 33 of the present invention works well with balanced clock distributions. In balanced distributions, the clock feedback is representative of what occurs on the entire chip. The performance of the independent clock edge regulator 33 is further improved with distributions where all clock buffer circuit delays are enclosed by the feedback loops 42 and 44. Such enclosure removes the buffer circuit process variations from the chip clock skew.

The independent clock edge regulator decreases the clock duty cycle skew of the related clock over conventional designs. Accordingly, more machine cycle time is devoted to performing useful logic and less is devoted to covering clock skew.

CLOCK REGULATOR WITH PRECISION MIDCYCLE EDGE TIMING

The split clock buffer 10 and the independent clock edge regulator 33 provide separate control of the clock distribution 35 edges. However, the mid-cycle edge of the output clock 32 is only regulated to match the mid-cycle edge of the input clock 20. Therefore, if input clock 20 does not have an accurate duty cycle of 50%, then the chip clock distribution 35 will not have a accurate (50%) duty cycle. The split clock buffer 10 and the independent clock edge regulator 33 cancel out the variations the chip clock chain introduces, but they do not provide an input time divider.

Figure 3:
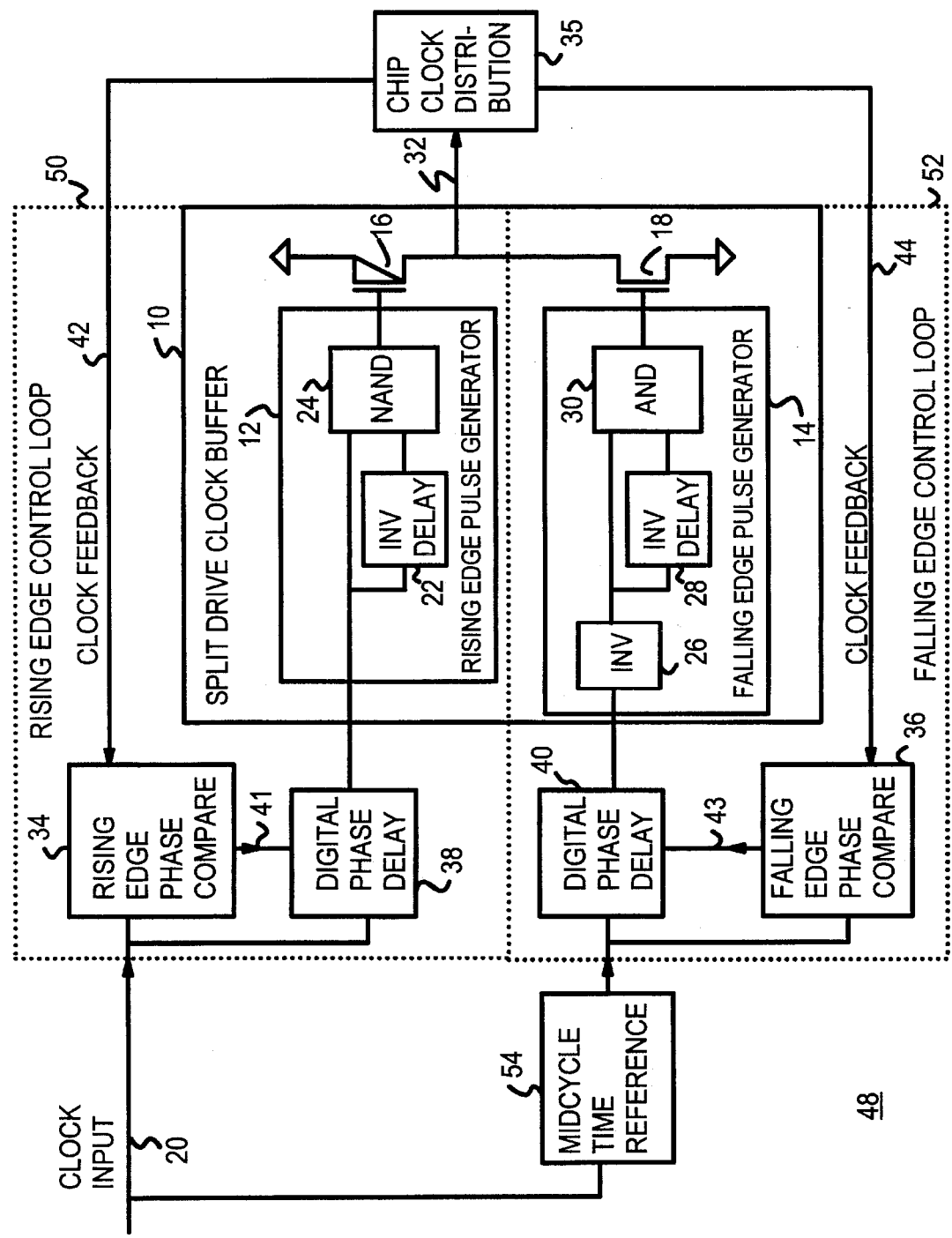
FIG. 3 is a block diagram of a clock regulator with including precision midcycle edge timing circuit in accordance with present invention.

Referring now to FIG. 3, a clock regulator with precision midcycle edge timing circuit 48 is shown that provides an input time divider. The circuit 48 includes a rising edge control loop 50, a falling edge control loop 52, and a midcycle time reference circuit 54.

The rising edge control loop 50 is driven by the input clock 20. The rising edge control loop 50 locks the clock distribution rise to the rising edge of the input clock 20. The falling edge control loop 52, however, is controlled by a precision time interval division of the clock period. The falling edge control loop locks 52 the clock distribution fall to the midpoint of the clock cycle. This midcycle time reference is provided by the midcycle time reference circuit 54, which is a precision time interval division circuit.

The purpose of the midcycle time reference 54 is to produce the rising edge half-way through the period of the input clock 20. This is done by examining the frequency or period of the input clock 20 and generating a subdivision of that time, which is provided to the falling edge control loop 52.

The chip clock distribution 32 is controlled as follows: its frequency matches that of the input clock 20, the phase of its rising edge matches that of the input clock 20, and the phase of the falling edge matches the time reference set by the midcycle time reference circuit 54, to provide a precision regulated midcycle edge.

PRECISION TIME INTERVAL DIVISION WITH DIGITAL PHASE DELAY LINES

Figure 4:
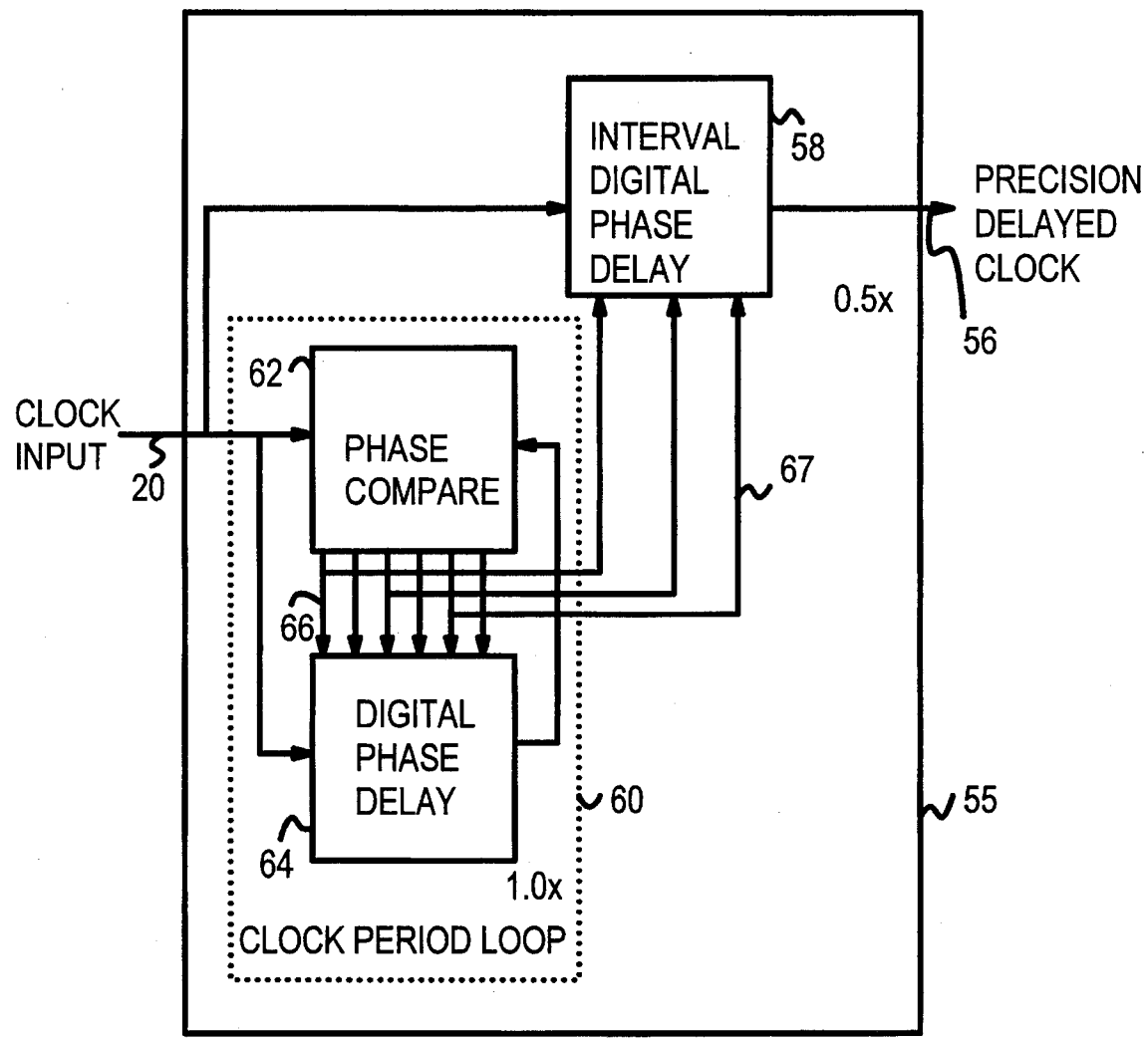
FIG. 4 is a block diagram depicting a time interval division circuit in accordance with present invention.

The midcycle time reference circuit 54 may be implemented in a variety of ways. FIG. 4 is a block diagram depicting a preferred embodiment of the circuit comprising the midcycle time reference circuit 54.

According to the present invention, the midcycle time reference circuit 54 is a time interval division circuit 55. The time interval division circuit 54 generates a delayed clock 56 that is a precise integer fraction of the clock cycle. The midcycle time reference 55 includes an interval digital phase delay 58 and a clock period loop 60, both of which receive the input clock 20. The clock period loop 60 includes a conventional phase compare 62 and a conventional digital phase delay 64. The phase compare 62 controls both the digital phase delay 64 and the interval digital phase delay 58 via control lines 66 and 67, respectively.

In the clock period loop 60, the phase compare 62 and digital phase delay 64 lock on the period of the input clock 20. That is, the phase compare 62 increases the delay of the digital phase delay 64 until the delayed clock lines up with the input clock 20. A first point of lock would be zero delay, which is not possible with conventional circuits. The next point of lock is one full clock cycle. Therefore a phase delay of one full clock cycle (1.0×) is produced.

Every other control line 66 from the phase compare 62 comprises the control lines 67 that control the interval digital phase delay 58. The interval digital phase delay 58 is constructed with half as many stages as the digital phase delay 64. Since the interval digital phase delay 58 has half as many active delay stages as the digital phase delay 64, the interval digital phase delay 58 generates a delayed clock signal 56 that is one-half of the input clock 20 period.

Accuracy is limited by the sensitivity of the phase compare 62 and the granularity of the digital phase delays 64 and 58. Obtaining the same delay per stage in the two phase delays 64 and 58 is achieved by interleaving the layout of the two delay lines to minimize mistracking due to cross-chip variation. Other ratios can be constructed either by choosing other subsets of the control lines for one or both of the phase delays 64 and 58. Another method is to increase the number of basic delay stages governed by a single control line in one or both phase delays 64 and 58.

According to the present invention, the time interval division circuit 55 produces precise integer fractions of the clock cycle without resorting to generating high frequency harmonics of the clock frequency followed by division circuits. Conventional delay chains also avoid high frequencies, but generate delays that do not scale as the clock frequency changes. The time interval division circuit 55 eliminates the need for a phase locked loop engineering work in designs that already incorporate digital phase delay circuits.

When the time interval division circuit 55 is used in conjunction with the clock regulator circuit of FIG. 3, the rising edge of the chip clock distribution 35 is a function of only the input clock 20 rising edge phase. The falling edge of the input clock 20 or the transistors that transmit either clock edge no longer matter. At no point is a frequency generated above the input clock frequency.

A method and system has been disclosed for increasing clock edge transition speed and edge phase accuracy by splitting an external clock signal and separately controlling the output transistors.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A clock edge regulator circuit, the clock edge regulator circuit coupled to a clock buffer that drives a clock distribution, the clock distribution having a rising edge and a falling edge, the circuit comprising:

an input clock signal having a rising edge and a falling edge;

rising edge regulator means responsive to the rising edge of the input clock signal and to the rising edge of the clock distribution for providing a first delayed clock signal to the clock buffer; and falling edge regulator means responsive to the falling edge of the input clock signal and to the falling edge of the clock distribution for providing a second delayed clock signal to the clock buffer, such that the rising and falling edges of the clock distribution are independently regulated.

2. A circuit as in claim 1 wherein the rising edge regulator means comprises:
   a first edge phase compare coupled to the input clock signal and to the clock distribution for detecting the phase difference between the rising edge of the input clock signal and the rising edge of the clock distribution; and
   a first digital phase delay coupled to the input clock signal and responsive to the first edge phase compare for generating the first delayed clock signal.

3. A circuit as in claim 2 wherein the falling edge regulator means comprises:
   a second edge phase compare coupled to the input clock signal and to the clock distribution for detecting the phase difference between the falling edge of the input clock and the falling edge of the clock distribution; and
   a second digital phase delay coupled to the input clock signal and responsive to the second edge phase compare for generating the second delayed clock signal.

4. A circuit as in claim 3 wherein the clock buffer is a split drive clock buffer including a rising pulse generator and a falling pulse generator, and wherein the rising edge regulator means provides the first delayed clock signal to the rising pulse generator, and the falling edge regulator means provides the second delayed clock signal to the falling pulse generator.

5. A method for providing two timing references per clock cycle on a single clock distribution, wherein an input clock signal having a phase, a rising edge, and a falling edge is input to a clock buffer that drives a clock distribution, the clock distribution having a phase, a rising edge and a falling edge, the method comprising the steps of:
   (a) comparing the phase difference between the rising edge of the input clock signal and the rising edge of the clock distribution;
   (b) generating a first delayed clock signal based on the phase difference between the rising edges;
   (c) comparing the phase difference between the falling edge of the input clock signal and the falling edge of the clock distribution;
   (d) generating a second delayed clock signal based on the phase difference between the falling edges;
   (e) providing the first delayed clock signal to the clock buffer; and
   (f) providing the second delayed clock signal to the clock buffer.

6. A method as in claim 5 wherein the clock buffer is a split drive clock buffer including a rising pulse generator and a falling pulse generator, and wherein step (e) includes the step of providing the first delayed clock signal to the rising pulse generator, and wherein step (f) includes the step of providing the second delayed clock signal to the falling pulse generator.

7. A method as in claim 6 wherein step (a) is performed by a first phase compare circuit.

8. A method as in claim 7 wherein step (b) is performed by a first phase delay circuit.

9. A method as in claim 8 wherein step (c) is performed by a second phase compare circuit.

10. A method as in claim 9 wherein step (d) is performed by a second phase delay circuit.

11. A clock edge regulator circuit that provides two timing references per clock cycle on a single clock distribution, the clock edge regulator comprising:
    an input clock signal having phase, a rising edge, and a falling edge;
    a clock distribution having a phase, a rising edge and a falling edge;
    a clock buffer coupled to the clock distribution;
    a first edge phase compare coupled to the input clock signal and to the clock distribution for detecting the phase difference between the rising edge of the input clock signal and the rising edge of the clock distribution;
    a second edge phase compare coupled to the input clock signal and to the clock distribution for detecting the phase difference between the falling edge of the input clock signal and the falling edge of the clock distribution;
    a first digital phase delay coupled to the input clock signal and responsive to the first edge phase compare for providing a first delayed clock signal to the clock buffer; and
    a second digital phase delay coupled to the input clock signal and responsive to the second edge phase compare for providing a second delayed clock signal to clock buffer, such that the rising and falling edges of the clock distribution are independently regulated.

12. A circuit as in claim 11 wherein the clock buffer is a split drive clock buffer including a rising pulse generator and a falling pulse generator, and wherein first delayed clock signal is provided to the rising pulse generator, and the second delayed clock signal is provided to the falling pulse generator.

* * * * *